United States Patent
Shimizu

(10) Patent No.: US 10,043,719 B2
(45) Date of Patent: Aug. 7, 2018

(54) SEMICONDUCTOR WAFER EVALUATION METHOD AND SEMICONDUCTOR WAFER MANUFACTURING METHOD

(71) Applicant: SHIN-ETSU HANDOTAI CO., LTD., Tokyo (JP)

(72) Inventor: Yuichi Shimizu, Nishigo-mura (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 378 days.

(21) Appl. No.: 14/410,514

(22) PCT Filed: Jun. 11, 2013

(86) PCT No.: PCT/JP2013/003638
§ 371 (c)(1),
(2) Date: Dec. 22, 2014

(87) PCT Pub. No.: WO2014/010166
PCT Pub. Date: Jan. 16, 2014

(65) Prior Publication Data
US 2015/0214123 A1    Jul. 30, 2015

(30) Foreign Application Priority Data
Jul. 9, 2012   (JP) .................................. 2012-153933

(51) Int. Cl.
*H01L 21/66*    (2006.01)
*H01L 21/02*    (2006.01)

(52) U.S. Cl.
CPC ........ *H01L 22/12* (2013.01); *H01L 21/02024* (2013.01); *H01L 22/20* (2013.01); *H01L 22/14* (2013.01); *H01L 2924/0002* (2013.01)

(58) Field of Classification Search
CPC ..... B24B 37/28; B24B 37/005; B24B 37/042; B24B 37/08; H01L 22/12; H01L 22/20; H01L 21/02024
(Continued)

(56) References Cited

U.S. PATENT DOCUMENTS

| 8,145,342 B2 * | 3/2012 | Bhagavat | ................ B24B 7/228 430/30 |
| 2002/0016072 A1 | 2/2002 | Hashii et al. | |

(Continued)

FOREIGN PATENT DOCUMENTS

| JP | A-2002-124490 | 4/2002 |
| JP | A-2003-229392 | 8/2003 |

(Continued)

OTHER PUBLICATIONS

Sep. 24, 2015 Office Action issued in Japanese Patent Application No. 2012-153933.

(Continued)

*Primary Examiner* — Monica Carter
*Assistant Examiner* — Lauren Beronja
(74) *Attorney, Agent, or Firm* — Oliff PLC

(57) ABSTRACT

A semiconductor-wafer evaluation method includes: before the mirror-polishing step, measuring warp data of displacement of the surface of the semiconductor wafer with a capacitive shape measurement device; setting a prescribed width of an outer circumferential portion of the semiconductor wafer as a sampling range; performing fitting of the warp data within the sampling range with a fitting function in a predetermined fitting range; calculating a difference (Range) between a maximum and a minimum of the warp data after the fitting within the sampling range; and, after the mirror-polishing step, evaluating the nanotopography of the (Continued)

surface of the semiconductor wafer on the basis of the calculated difference (Range).

4 Claims, 22 Drawing Sheets

(58) Field of Classification Search
USPC ........................................................ 451/5, 11
See application file for complete search history.

(56) References Cited

U.S. PATENT DOCUMENTS

| 2003/0170920 | A1 | 9/2003 | Bhagavat et al. |
| 2004/0072437 | A1 | 4/2004 | Iizuka et al. |
| 2005/0255610 | A1 | 11/2005 | Sato et al. |
| 2008/0166823 | A1 | 7/2008 | Okabe et al. |
| 2008/0166948 | A1* | 7/2008 | Bhagavat ............... B24B 7/228 451/5 |
| 2013/0139800 | A1* | 6/2013 | Zavattari ............... B28D 5/045 125/12 |

FOREIGN PATENT DOCUMENTS

| JP | A-2004-20286 | 1/2004 | |
| JP | WO 2006018961 A1 * | 2/2006 | ............... G01B 7/34 |
| JP | A-2006-294774 | 10/2006 | |
| JP | A-2009-027095 | 2/2009 | |
| JP | 4420023 B2 | 2/2010 | |
| WO | WO 2006/018961 A1 | 2/2006 | |

OTHER PUBLICATIONS

Jul. 16, 2014 International Search Report issued in International Application No. PCT/JP2013/003638.

Mar. 21, 2018 Office Action issued in Korean Patent Application No. 10-2015-7000415.

* cited by examiner $t = c - ( a + b )$

FITTING RANGE    $((ax+b)-f(x))^2$ IN EACH CELL

|  | [Liner | Fitting in the range of 120 mm to 130 mm approximation by the least squares method $((ax+b)^2-f(x)^2)$] | | | | | | |
|---|---|---|---|---|---|---|---|---|
| r | 0 deg | 45 deg | 90 deg | 135 deg | 180 deg | 225 deg | 270 deg | 315 deg |
| 120 | 0.000171 | 5.56E-05 | 0.000468 | 0.000199 | 0.000292 | 0.000783 | 8.38E-05 | 0.001461 |
| 121 | 8.8E-05 | 1.22E-05 | 0.000288 | 0.000128 | 8.31E-06 | 4.48E-05 | 1.41E-07 | 0.000126 |
| 122 | 3.92E-05 | 0.000102 | 6.06E-05 | 7.85E-05 | 1.92E-05 | 2.5E-05 | 1.07E-05 | 6.56E-05 |
| 123 | 2.09E-05 | 8.64E-05 | 3.96E-06 | 9.99E-06 | 1.25E-05 | 8.02E-05 | 1.34E-06 | 0.000193 |
| 124 | 1.71E-05 | 2.72E-05 | 0.000225 | 8.37E-05 | 2.12E-06 | 9.08E-05 | 4.46E-07 | 0.00016 |
| 125 | 0.000353 | 3.18E-05 | 0.000778 | 0.000471 | 3.68E-05 | 5.01E-05 | 6.11E-07 | 0.000169 |
| 126 | 0.000854 | 0.000236 | 0.001184 | 0.000789 | 9.15E-05 | 0.000203 | 5.06E-05 | 0.000477 |
| 127 | 0.000573 | 0.000165 | 0.00046 | 0.000453 | 0.000211 | 0.000464 | 8.13E-05 | 0.00066 |
| 128 | 1.03E-05 | 2.29E-05 | 2.22E-06 | 1.83E-05 | 0.000101 | 0.000211 | 1.28E-05 | 0.000203 |
| 129 | 0.000228 | 3.15E-05 | 0.00037 | 0.000157 | 2.79E-05 | 5.99E-05 | 1.59E-05 | 0.000216 |
| 130 | 0.000926 | 0.000151 | 0.001302 | 0.001109 | 0.000543 | 0.001415 | 9.73E-05 | 0.001985 |

|  | 0 deg | 45 deg | 90 deg | 135 deg | 180 deg | 225 deg | 270 deg | 315 deg |
|---|---|---|---|---|---|---|---|---|
| SUM | 0.003288 | 0.000922 | 0.005541 | 0.003478 | 0.001346 | 0.003428 | 0.000356 | 0.005746 |
| const a | 0.06574 | 0.126224 | 0.05268 | 0.03288 | 0.0016116 | 0.04317 | 0.04812 | 0.04818 |
| const b | -8.8907 | -12.268 | -6.7759 | -5.9314 | -0.2185 | -5.8972 | -6.39074 | -7.7058 |

This is $\Sigma[((ax+b)-f(x))^2]$ at a radial position from 120mm to 130mm.
* use of least squares method Constants a and b are automatically determined by Solver such that total of cells becomes minimum.

(b)

```
Sub  DATA ANALYSIS()

SolverOk SetCell:="$V$58", MaxMinVal:=2, ValueOf:="0", ByChange:="$V$57:$V$58"
    SolverSolve Userfinish:=True
    SolverOk SetCell:="$W$58", MaxMinVal:=2, ValueOf:="0", ByChange:="$W$57:$W$58"
    SolverSolve Userfinish:=True
    SolverOk SetCell:="$X$58", MaxMinVal:=2, ValueOf:="0", ByChange:="$X$57:$X$58"
    SolverSolve Userfinish:=True
    SolverOk SetCell:="$Y$58", MaxMinVal:=2, ValueOf:="0", ByChange:="$Y$57:$Y$58"
    SolverSolve Userfinish:=True
    SolverOk SetCell:="$Z$58", MaxMinVal:=2, ValueOf:="0", ByChange:="$Z$57:$Z$58"
    SolverSolve Userfinish:=True
    SolverOk SetCell:="$AA$58", MaxMinVal:=2, ValueOf:="0", ByChange:="$AA$57:$AA$58"
    SolverSolve Userfinish:=True
    SolverOk SetCell:="$AB$58", MaxMinVal:=2, ValueOf:="0", ByChange:="$AB$57:$AB$58"
    SolverSolve Userfinish:=True
    SolverOk SetCell:="$AC$58", MaxMinVal:=2, ValueOf:="0", ByChange:="$AC$57:$AC$58"
    SolverSolve Userfinish:=True Range("C17").Select
    Selection.Copy End Sub
```

SEMICONDUCTOR WAFER EVALUATION METHOD AND SEMICONDUCTOR WAFER MANUFACTURING METHOD

TECHNICAL FIELD

The present invention relates to a semiconductor-wafer evaluation method and a manufacturing method by using the same.

BACKGROUND ART

A manufacturing method of a semiconductor wafer, such as a silicon single crystal wafer, generally includes a slicing step of slicing a single crystal ingot obtained by the Czochralski method (CZ method) into a thin disk wafers; a chamfering step of chamfering an outer circumferential portion to prevent breakage and chips of the wafer; a lapping step of flattening the wafer; an etching step of removing process strain residing in a surface layer of the wafer due to these steps; a mirror-polishing step of polishing a wafer surface into a mirror surface; and a cleaning step of removing contaminants such as a polishing agent and extraneous substances attached in the polishing step. A heat treatment or a grinding step other than the above steps may be added, the order of the steps may be changed, or the same step may be performed multiple times, as needed.

In recent years, a sallow trench isolation (STI) process or the other process is used as a minute device technique as semiconductor devices have been more integrated. Accordingly, formation of a circuit wiring pattern on a surface of a semiconductor wafer needs to form a flatter insulator film with a more uniform thickness on the semiconductor wafer; a method of flattening an insulator film by, for example, chemical mechanical polishing (CMP) is used in semiconductor device fabrication processes.

In the past, minute uneven shape (also referred to as waviness below) of a surface of a semiconductor wafer does not particularly affect the semiconductor device fabrication processes. On the contrary, STI causes the problem in that the thickness of an insulator film becomes nonuniform due to the above waviness, because CMP selectively polishes convex parts. Waviness is represented by a parameter called nanotopography. Nanotopography is an indicator representing flatness of a wafer surface and represents waviness of the wafer surface in a non-absorption state in a spatial wavelength ranging from 0.1 mm to several tens of millimeters.

Nanotopography is generally measured with an instrument such as Nanomapper made by ADE Corp., NanoPro made by KLA-Tencor Corp., or Dynasearch made by Raytex Corp. Since these instruments are optical instruments and take measurements by using surface reflection from an object to be measured, a subject wafer needs to have a mirror surface with a relatively high reflectance.

The values of nanotopography measured with these instruments for wafers that are subjected merely intermediate steps and hence have surfaces with low reflection, such as sliced wafers and ground wafers, are therefore inaccurate and unreliable.

In addition, factors that degrade nanotopography at the intermediate steps in the wafer manufacturing method in recent years include waviness that appears in a wire travelling direction when a single crystal ingot is sliced with a wire saw, and ring-shaped waviness that appears in a lapping step or a double-disc grinding step.

There is a proposed method of performing a double-disc grinding step, a double-side lapping step, and a double-side polishing step after slicing to reduce such waviness (See Patent Document 1, for example).

Patent Document 1 discloses that the double-disc grinding step removes a layer of strain and macro waviness components that are formed in a wafer surface during slicing and improves flatness of the wafer, and the subsequent double-side lapping step removes minute surface waviness created in the double-disc grinding step.

The size of the waviness created during slicing however may greatly vary depending on the performance of a slicing apparatus to be used, specifications of a wire, slicing conditions, and failure such as wire disconnection during slicing. Similarly, the size of the waviness appearing during the lapping step may vary depending on a turn table and a carrier. The size of the waviness appearing during the double-disc grinding may vary depending on relation of relative position between grinding wheels and a wafer, and quality of the grinding wheels.

Since it is difficult to remove residual waviness created on the wafer surface due to these factors in the mirror-polishing step, which is the final step, the size of waviness that appeared needs to be monitored and controlled at the intermediate steps, such as the slicing step or the lapping step, in the wafer manufacturing method. A conventional optical measurement method using surface reflection however has the problem in that the waviness cannot be precisely detected.

A conventional method proposed to measure the waviness of a semiconductor wafer having a low reflectance is to band-pass filtering warp data obtained with a capacitive shape measurement device by cutting off wavelength ranges of at least a short wavelength period of 1 mm or less and a long wavelength period of 50 mm or more (See Patent Document 2, for example).

CITATION LIST

Patent Literature

Patent Document 1: Japanese Unexamined Patent publication (Kokai) No. 2002-124490
Patent Document 2: International Publication WO2006/018961

SUMMARY OF INVENTION

Technical Problem

Warp data of wafers subjected to slicing, lapping, and grinding however does not exhibit its actual shape due to process strain, thereby causing the above problem that waviness cannot be precisely detected. It is accordingly necessary to remove the process strain by etching such that the warp data exhibits the actual shape and then to detect the waviness with the above measuring method. This procedure makes it impossible to efficiently control steps, such as the lapping and grinding steps.

The present invention was accomplished in view of the above-described problems. It is an object of the present invention to provide a method that enables the nanotopography of a semiconductor wafer after a mirror-polishing step to be precisely evaluated at an intermediate step in semiconductor-wafer manufacture.

Solution to Problem

To achieve this object, the present invention provides a semiconductor-wafer evaluation method of evaluating nanotopography of a surface of a semiconductor wafer manufactured by a manufacturing method including a slicing step, a lapping step and/or a grinding step, an etching step, and a mirror-polishing step, comprising: before the mirror-polishing step, measuring warp data of displacement of the surface of the semiconductor wafer with a capacitive shape measurement device; setting a prescribed width of an outer circumferential portion of the semiconductor wafer as a sampling range; performing fitting of the warp data within the sampling range with a fitting function in a predetermined fitting range to thereby eliminate an effect of variation in the warp data at the outer circumferential portion of the semiconductor wafer, the variation being caused by process strain; calculating a difference (Range) between a maximum and a minimum of the warp data after the fitting within the sampling range; and after the mirror-polishing step, evaluating the nanotopography of the surface of the semiconductor wafer on the basis of the calculated difference (Range).

This evaluation method enables a surface status of the semiconductor wafer before the mirror-polishing step, which has residual strain due to the grinding step etc., and non-mirrored surfaces, to be efficiently evaluated such that the evaluation is precise and highly correlated with the nanotopography of the semiconductor wafer after the mirror-polishing step.

In the method, the sampling range is preferably set within a range between an edge of the semiconductor wafer and a position 1/10 of a diameter radially away from the edge, and the fitting range is preferably set within a width ranging between the position 1/10 of the diameter radially away from the edge of the semiconductor wafer and 1/30 of the diameter radially therefrom toward the edge.

Setting the sampling range and the fitting range in this way enables ring unevenness at the outer circumferential portion, which affects the nanotopography of the mirror-polished semiconductor wafer, to be reliably evaluated with high precision before mirror-polishing.

In the method, the fitting function is preferably a linear function.

This type of fitting function makes the evaluation easier and more precise.

In the method, if the calculated difference (Range) is equal to or less than 0.7 μm, then the semiconductor wafer is preferably judged as non-defective.

Judging non-defective in this way enables the nanotopography of the semiconductor wafer to be efficiently evaluated with more highly precision.

The present invention also provides a semiconductor-wafer manufacturing method comprising a slicing step, a lapping step and/or a grinding step, an etching step, and a mirror-polishing step, wherein a semiconductor wafer subjected to at least one of the slicing step, the lapping step, the grinding step, and an etching step is evaluated by the inventive semiconductor-wafer evaluation method, and a semiconductor wafer is manufactured while at least one of the slicing step, the lapping step, the grinding step, and an etching step is controlled on the basis of a result of the evaluation.

This semiconductor-wafer manufacturing method enables failure etc., in the manufacturing steps to be grasped in an early stage, thereby enabling efficient reliable manufacture of a semiconductor wafer having good nanotopography with reduced manufacture losses and improved yield.

Advantageous Effects of Invention

As described above, according to the present invention, the nanotopography of a semiconductor wafer can be efficiently evaluated with high precision before the mirror-polishing step.

BRIEF DESCRIPTION OF DRAWINGS

FIG. 15 is an explanatory diagram of determining a fitting function;

DESCRIPTION OF EMBODIMENTS

The present inventor thought that it is desirable to detect, at the time of completion of an intermediate step, waviness at the outer circumferential portion of a semiconductor wafer, which is conventionally detectable after the mirror-polishing step, i.e., the final step of a semiconductor-wafer manufacturing method. The inventor conceived evaluation with warp data obtained by using a capacitive shape measurement device to measure a surface of a semiconductor wafer after an intermediate step, such as for example a semiconductor wafer having process strain after the lapping step. The inventor further considered as follows.

Figure 1:
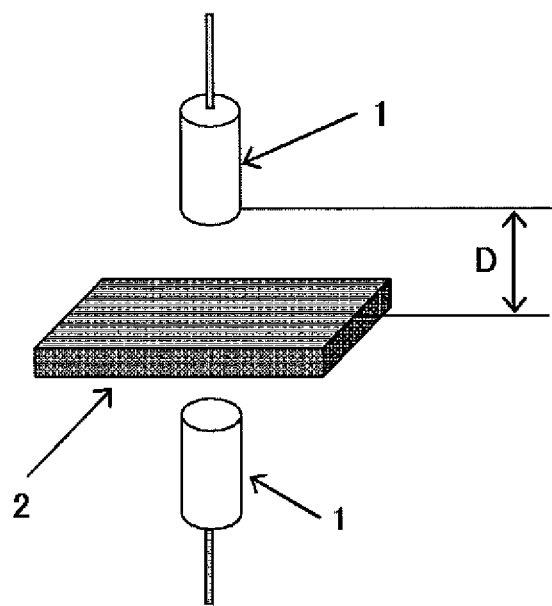
FIG. 1 is an explanatory diagram of the principle of a measuring method with a capacitive shape measurement device that can be used in the present invention.
Figure 2:
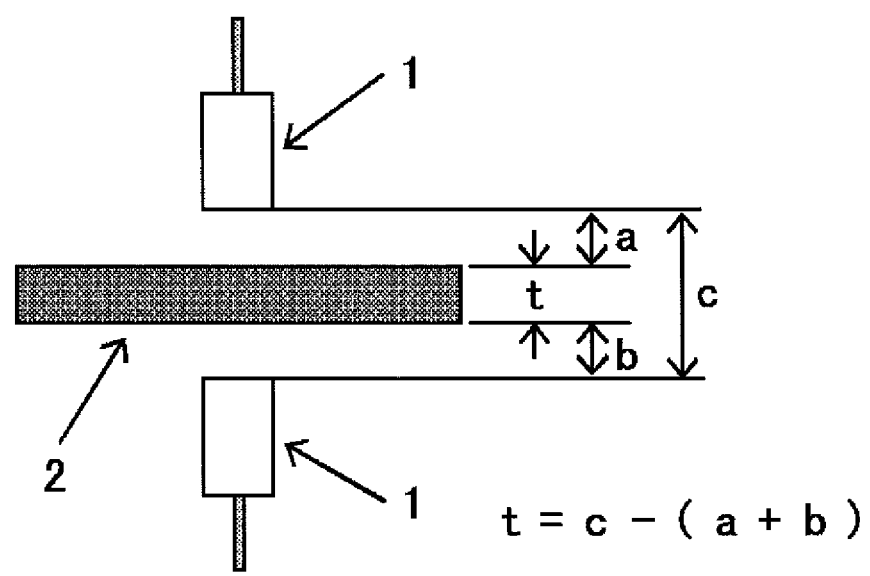
FIG. 2 is an explanatory diagram of the principle of a measuring method with a capacitive shape measurement device that can be used in the present invention.

FIGS. 1 and 2 show the principle of a measuring method with a capacitive shape measurement device that can be used in the present invention.

Generally, shape measurement of capacitive type refers the thickness of an object to be measured (a semiconductor wafer). As shown in FIG. 1, probes 1 and an object 2 to be measured create capacitance, which varies depending on variation in distance D between the probes 1 and the object 2 to be measured. A capacitance-to-voltage convertor outputs a voltage proportional to the distance D to measure displacement. As shown in FIG. 2, when the probes 1, which are a displacement sensor, are fixed on both sides of the object 2 to be measured at a known distance 'c' to measure displacement 'a' and displacement 'b', the thickness 't' of the object 2 to be measured can be calculated by the equation t=c−(a+b).

The present invention conducts analysis by using the surface displacement a or b, instead of using the thickness t of the object to be measured. The reason is that a parameter called nanotopography is measured by using a surface of a semiconductor wafer as a point of reference. The data thus obtained by measurement of the surface displacement a or b is referred to as warp data.

Figure 3:
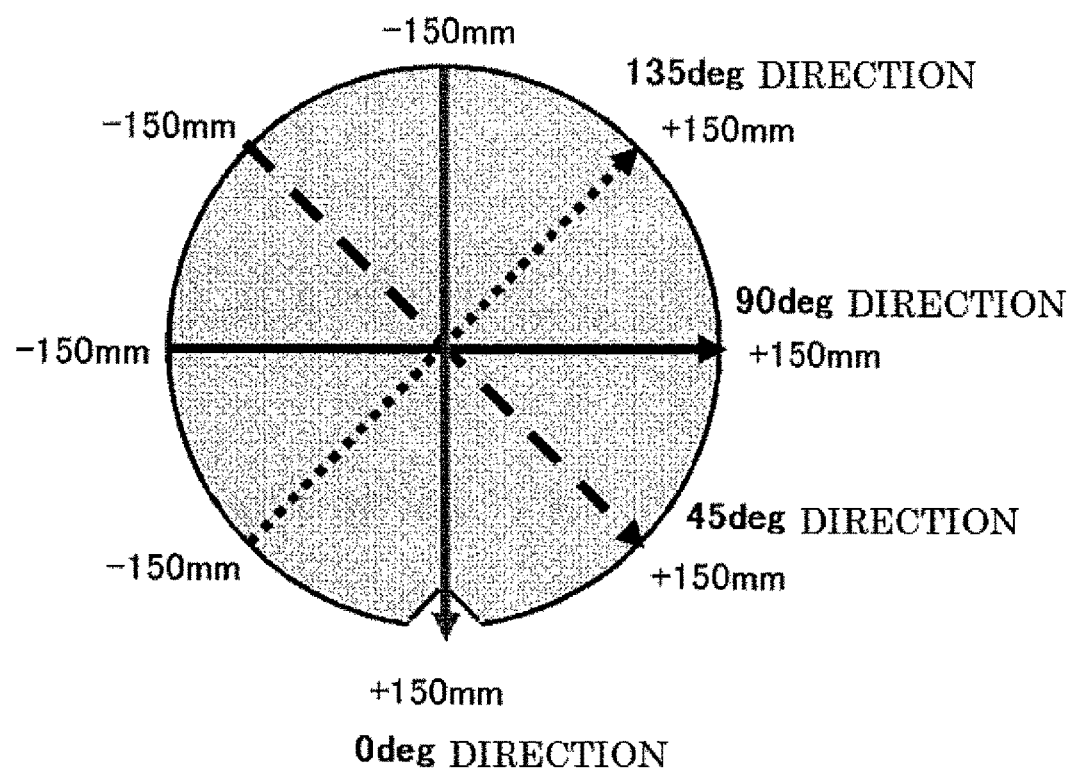
FIG. 3 is a diagram showing conditions of measurement of warp data.
Figure 4:
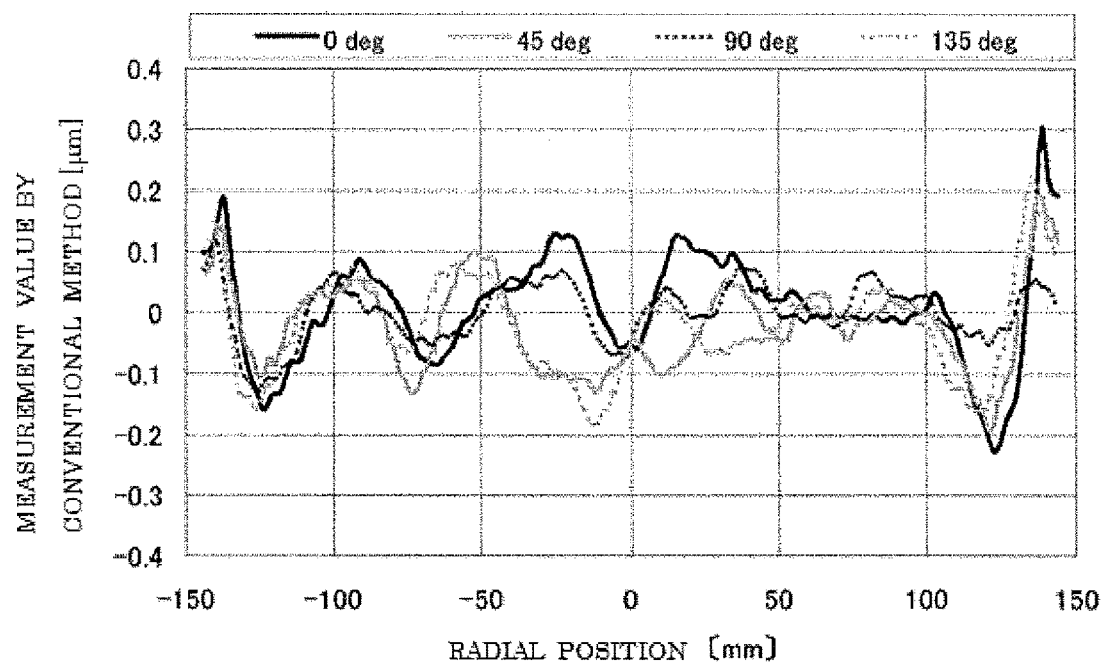
FIG. 4 is a graph of a cross-sectional shape obtained by conventional analysis of warp data of a semiconductor wafer after lapping.
Figure 5:
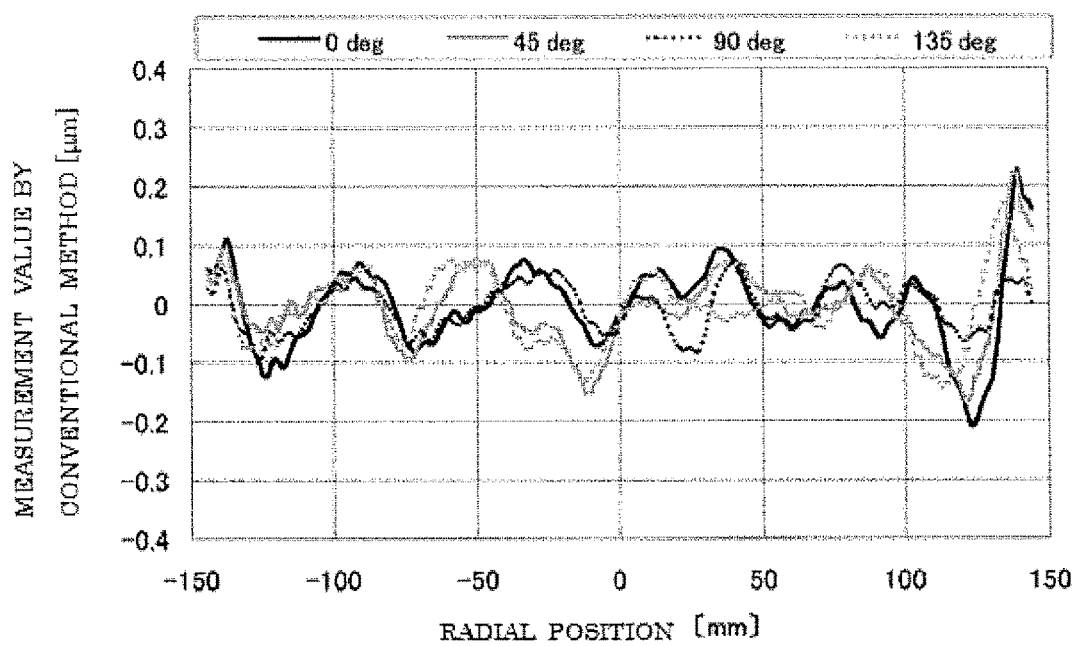
FIG. 5 is a graph of a cross-sectional shape obtained by conventional analysis of warp data of a semiconductor wafer after etching.

When a conventional method is used in which the warp data is band-pass filtered by cutting off wavelength ranges of at least a short wavelength period of 1 mm or less and a long wavelength period of 50 mm or more under conditions of measuring four lines (0, 45, 90, 135 degrees) as shown in FIG. 3, a semiconductor wafer having process strain after the lapping step, for example, exhibits a cross-sectional shape as shown in FIG. 4. When the same method is used to measure a semiconductor wafer after the etching step, the semiconductor wafer after the etching step exhibits a cross-sectional shape as shown in FIG. 5, because almost all of the process strain has been removed and data close to actual warp data can be obtained.

The displacement of unevenness at the outer circumferential portion of the semiconductor wafer after the lapping step (FIG. 4) and the semiconductor wafer after the etching step (FIG. 5), obtained in the above manner, were compared one-to-one with the displacement of ring unevenness at the outer circumferential portion of the mirror-polished wafer after the subsequent double-side mirror polishing step, measured with Nanomapper, and the correlation was investigated.

Figure 6:
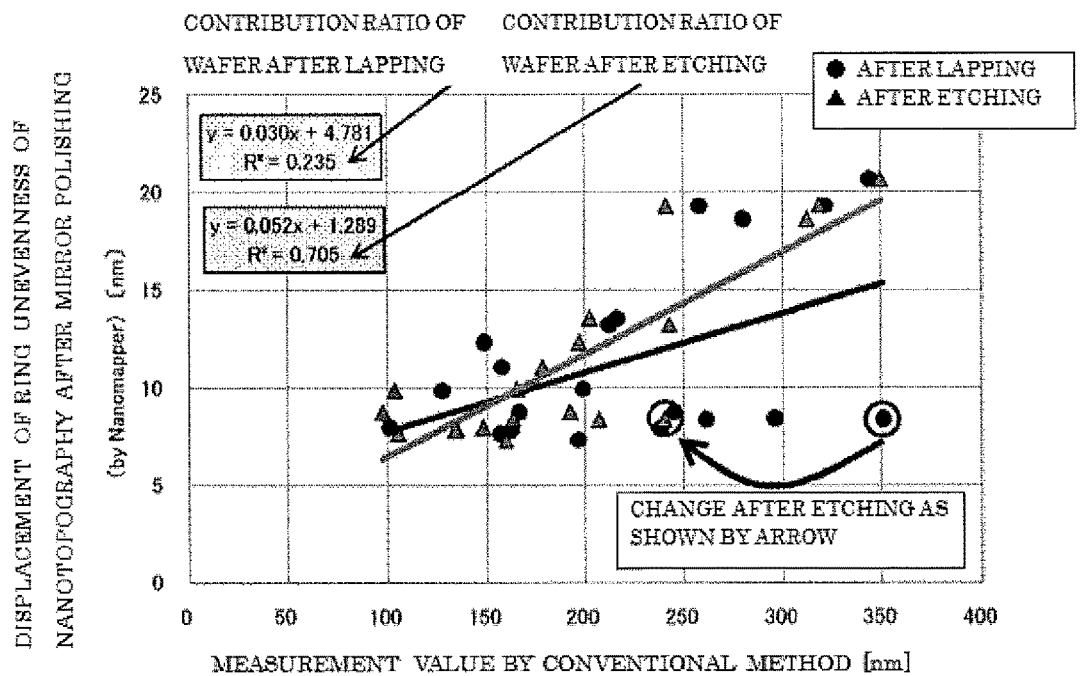
FIG. 6 is a graph of correlation of the nanotopography of a mirror-polished wafer with respect to data obtained by conventional analysis of the warp data of a semiconductor wafer after lapping and the semiconductor wafer after etching.

As shown in FIG. 6, the result was that a contribution ratio (a square of a correlation coefficient) of the wafer having process strain after the lapping step was 0.24, which is lower than a contribution ratio of 0.71 of the wafer after the etching step.

Figure 7:
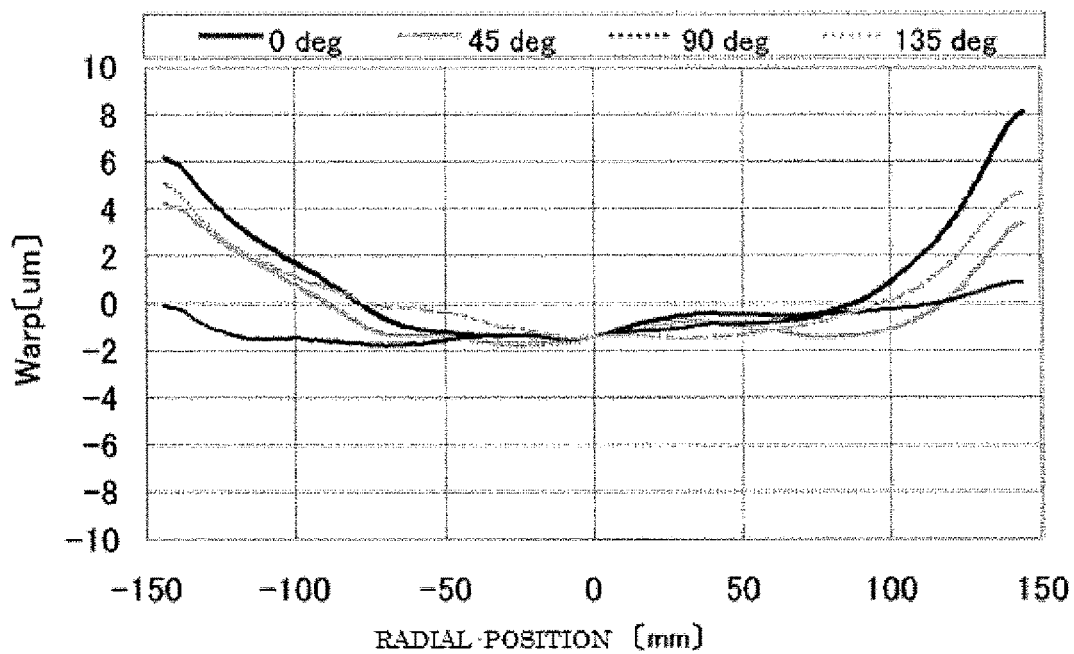
FIG. 7 is a graph of the warp data of a wafer after the lapping step.
Figure 8:
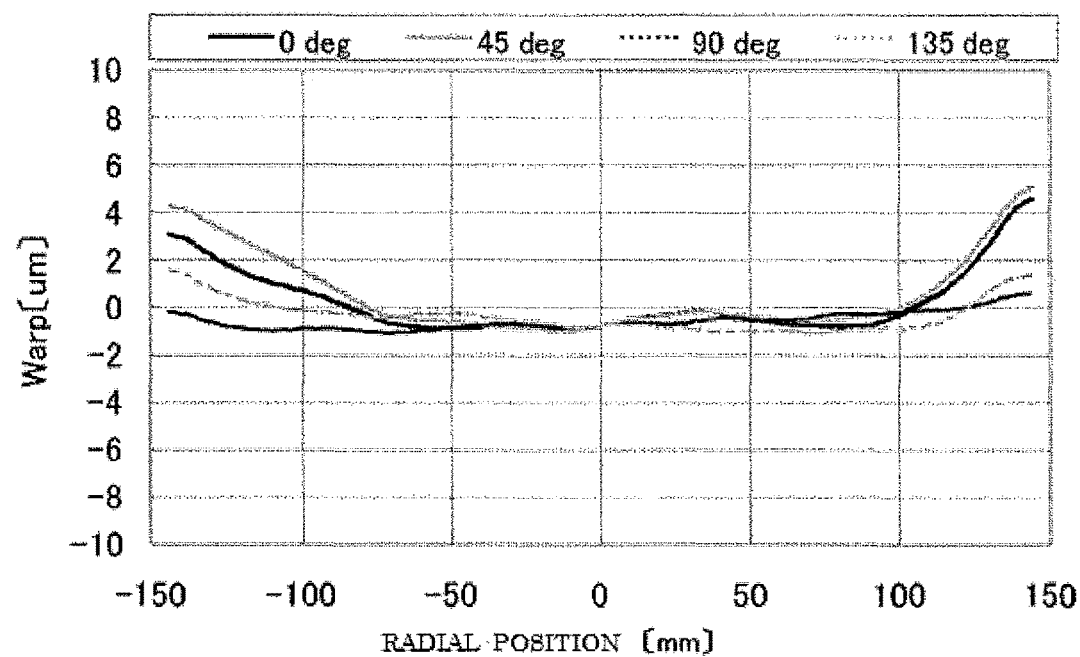
FIG. 8 is a graph of the warp data of a wafer after the etching step.

FIG. 7 shows warp data of the wafer having process strain after the lapping step. FIG. 8 shows warp data of the wafer after the etching step following the lapping step. In FIG. 7, the difference between the warp data of the wafer after the lapping step and the wafer after the slicing step (referred to as ΔWarp below) was as follows:

ΔWarp (warp data after the lapping step−warp data after the slicing step)=4.6 μm In FIG. 8, the difference ΔWarp between the warp data of the wafer after the etching step following the lapping step and the wafer after the slicing step was as follows:

ΔWarp (warp data after the etching step−warp data after the slicing step)=1.9 μm The problem of the conventional measuring method is that if the difference ΔWarp between the warp data of the wafer having process strain after the lapping step and the wafer after the slicing step is large as shown in FIG. 7, linear variation in the warp data of the outer circumferential portion becomes seemingly larger in comparison with the wafer having a small ΔWarp after process strain has been removed by etching as shown in FIG. 8; consequently apparent displacement of unevenness at the outer circumferential portion also becomes larger. In addition, since the wafer having process strain after the lapping step has large variations in ΔWarp, the correlation with the nanotopography of the wafer after the mirror-polishing step is low.

It is however known from inventor's experience that nanotopography is greatly affected by curvilinear components in warp data, or presence or absence of an inflection point. The inventor then found that when the great linear variation in warp data due to process strain at the outer circumferential portion is removed, nanotopography can be evaluated with high precision.

On the basis of the above knowledge, the inventor found that fitting of the warp data of a semiconductor wafer before mirror-polishing as above enables evaluation that is highly correlated with the nanotopography of the wafer after mirror-polishing, thereby bringing the present invention to completion.

An embodiment of the present invention will be described below in detail with reference to the drawings, but the present invention is not limited to this embodiment.

In the present invention, nanotopography of a surface of a semiconductor wafer, such as a silicon single crystal wafer, manufactured by a manufacturing method including a slicing step, a lapping step and/or a grinding step, an etching step, and a mirror-polishing step is evaluated before the mirror-polishing step. Here, it suffices to perform at least one of the lapping step and the grinding step, or both of them may be performed.

This evaluation includes before the mirror-polishing step, measuring warp data of displacement of the surface of the semiconductor wafer with a capacitive shape measurement device; setting a prescribed width of an outer circumferential portion of the semiconductor wafer as a sampling range; performing fitting of the warp data within the sampling range with a fitting function in a predetermined fitting range to thereby eliminate an effect of variation in the warp data at the outer circumferential portion of the semiconductor wafer, the variation being caused by process strain; calculating a difference (Range) between a maximum and a minimum of the warp data after the fitting within the sampling range; and after the mirror-polishing step, evaluating the nanotopography of the surface of the semiconductor wafer on the basis of the calculated difference (Range).

Since semiconductor wafers do not have mirror surfaces before the mirror-polishing step, the precision of evaluation with an optical instrument is low, and thus the evaluation is difficult. The present invention accordingly conducts evaluation by using warp data measured with the above-described capacitive shape measurement device as shown in FIGS. 1 and 2. Before the mirror-polishing step, since process strain due to the grinding step or the like remains, seemingly, the warp data greatly varies due to the process strain. In the present invention, the warp data is subjected to fitting with specified three parameters of a sampling range of the outer circumferential portion of a wafer, a fitting range, and a fitting function to thereby eliminate an effect of variation in the warp data due to the process strain, and a difference (Range) between the maximum and the minimum is calculated. The nanotopography after polishing can thereby be evaluated with high precision on the basis of the calculated difference (Range). The present invention thus enables evaluation that is highly correlated with the nanotopography of a semiconductor wafer surface after the mirror-polishing step to be conducted at an intermediate step before the mirror-polishing step, thereby enabling manufacturing conditions etc., in each step to be efficiently controlled with high precision.

Setting of the sampling range of the outer circumferential portion of the warp data and setting of the fitting range in the sampling range will now be described.

Figure 9:
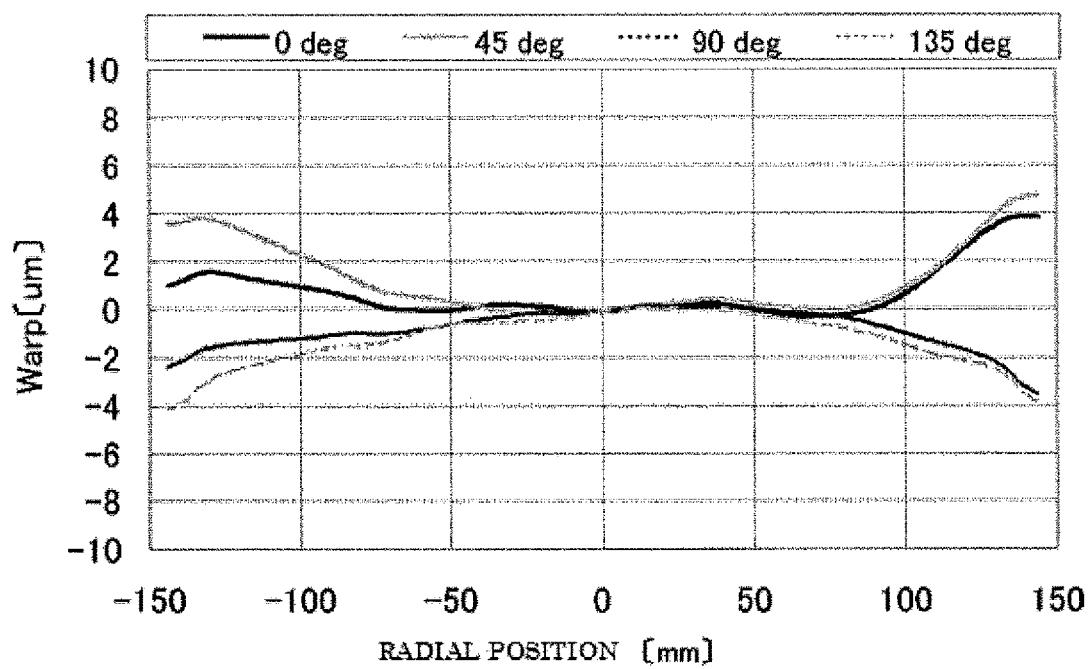
FIG. 9 is a graph of the warp data of a semiconductor wafer after the lapping step.

A silicon single crystal wafer having a diameter of 300 mm manufactured by the CZ method was used as a sample wafer. The warp data of the wafer that is subjected to the lapping step and hence has process strain was measured with a capacitive shape measurement device under measuring conditions of four lines (0, 45, 90, 135 degrees) as shown in FIG. 3, a flatness quality area (FQA) of 294 mm, and a measurement interval of 1 mm. The obtained warp data is given in FIG. 9.

Figure 10:
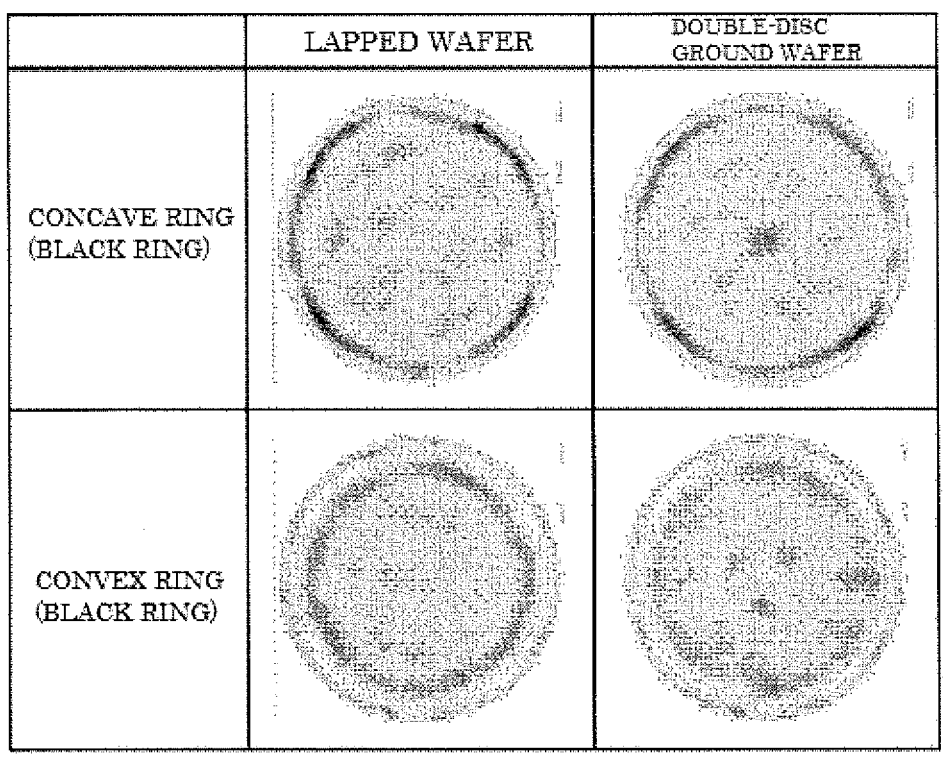
FIG. 10 is a diagram showing positions of displacement of ring unevenness at the outer circumferential portion of a wafer that has etched and mirror-polished after grinding and a wafer that has etched and mirror-polished after lapping.

In the warp data of a wafer subjected to lapping and a wafer subjected to double-disc grinding measured under the conditions shown in FIG. 3, as shown in FIG. 10, positions of displacement of ring unevenness at the outer circumferential portion, which greatly affects the nanotopography of a mirror-polished wafer surface subjected to the etching step and the mirror-polishing step, do not differ greatly between for the lapped wafer (the wafer subjected to etching and mirror-polishing after lapping) and the double-disc ground wafer (the wafer subjected to etching and mirror-polishing after grinding).

Figure 11:
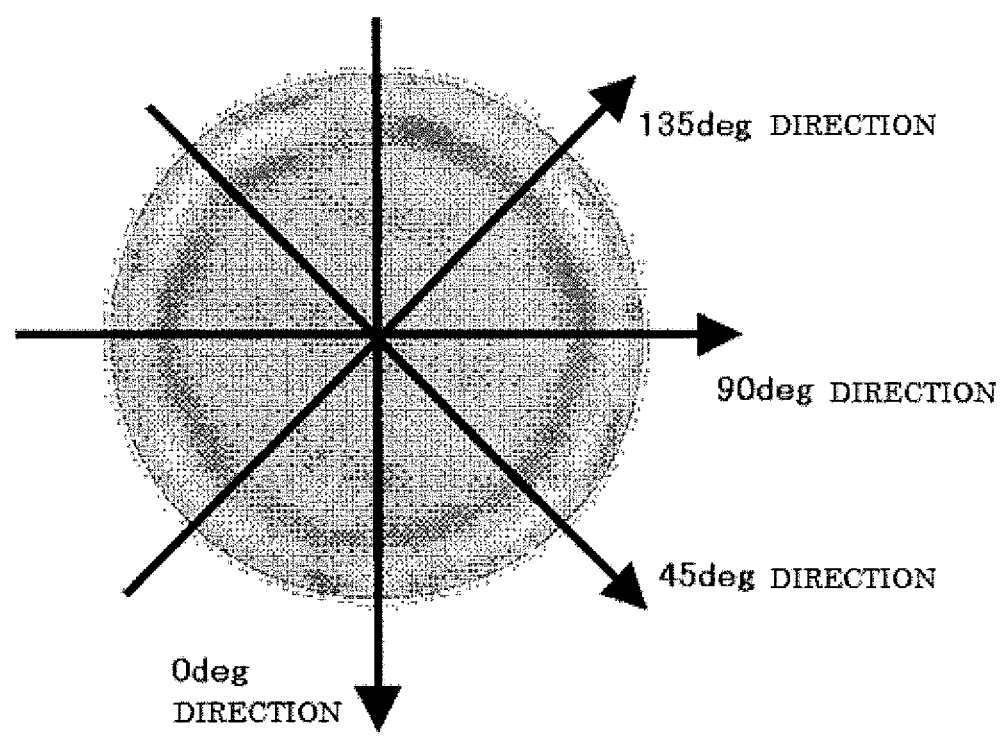
FIG. 11 is a diagram showing conditions of measurement of nanotopography and a cross-sectional shape.
Figure 12:
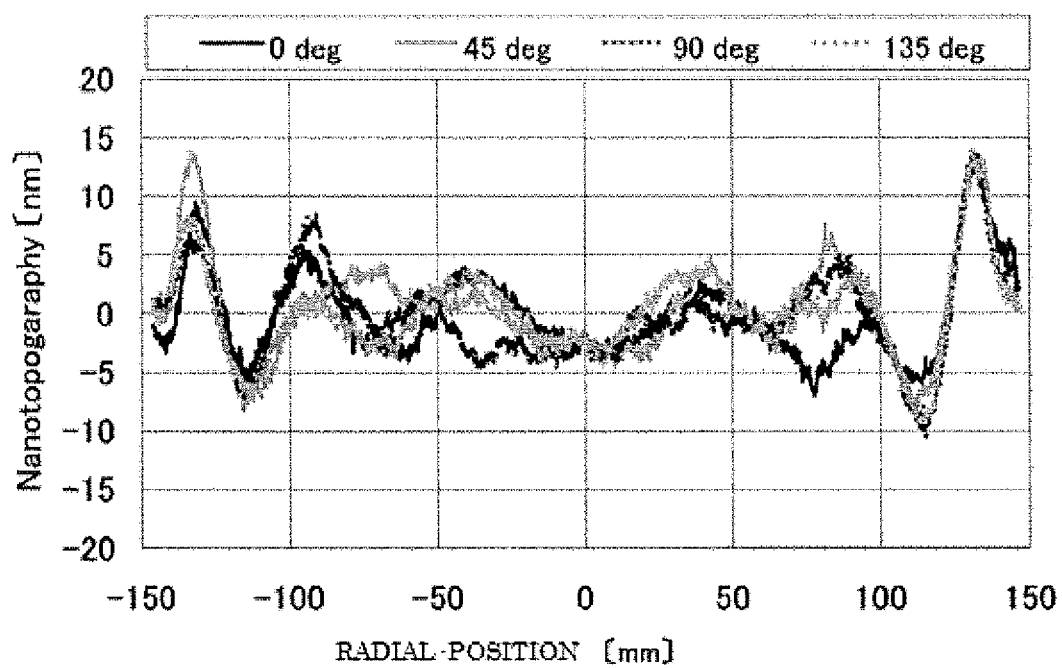
FIG. 12 is a graph of the cross-sectional shape of the nanotopography of a semiconductor wafer.

From considerations of cross-sectional shape data shown in FIG. 12 depending on the nanotopography shown in FIG. 11, the positions of displacement of ring unevenness generally have an extremum at 130 mm radially from the center (O), i.e., a position $1/15$ of its diameter radially away from the edge of the wafer toward the center.

A reference plane is needed to evaluate curvilinear variation in the warp data radially toward the edge from the 130-mm position in the radial direction. This needs warp data with a prescribed width in the direction from the 130-mm position in the radial direction toward the center. As seen in FIG. 7, if the warp data, for example, from a position of 100 mm to a position of 110 mm in the radial direction is sampled, then components of apparent curvilinear variation caused by process strain are included. The proper starting position of the reference plane is accordingly considered to be a position of 120 mm from the center (O) in the radial direction, i.e., a position $1/10$ of the diameter radially away from the edge toward the center.

From this consideration, the sampling range of the outer circumferential portion of the warp data is preferably a range between the edge and a position $1/10$ of the diameter radially away from the edge toward the center, and the fitting range of the warp data in the sampling range is preferably within a range between the above position $1/10$ of the diameter radially away from the edge toward the center and a position $1/30$ of the diameter radially therefrom toward the edge.

Accordingly, the warp data is measured and the sampling range and the fitting range can be set in the above manner.

As described above, since the ring evenness at the outer circumferential portion is created at substantially the same position, however, it is preferable to set the sampling range within the range between the edge of a semiconductor wafer and the position $1/10$ of the diameter radially away from the edge, and the fitting range within a width ranging between the position $1/10$ of the diameter radially away from the edge of the semiconductor wafer and $1/30$ of the diameter radially therefrom toward the edge, because the evaluation becomes precise and simple. In this case, for a 300-mm-diameter wafer, for example, the center is a point of reference (O); the sampling range is within a range between 120 mm radially therefrom toward the edge and the edge (a position of 150 mm); the fitting range is within a range between 120 mm radially toward the edge and 130 mm therefrom (the width is 10 mm).

Figure 13:
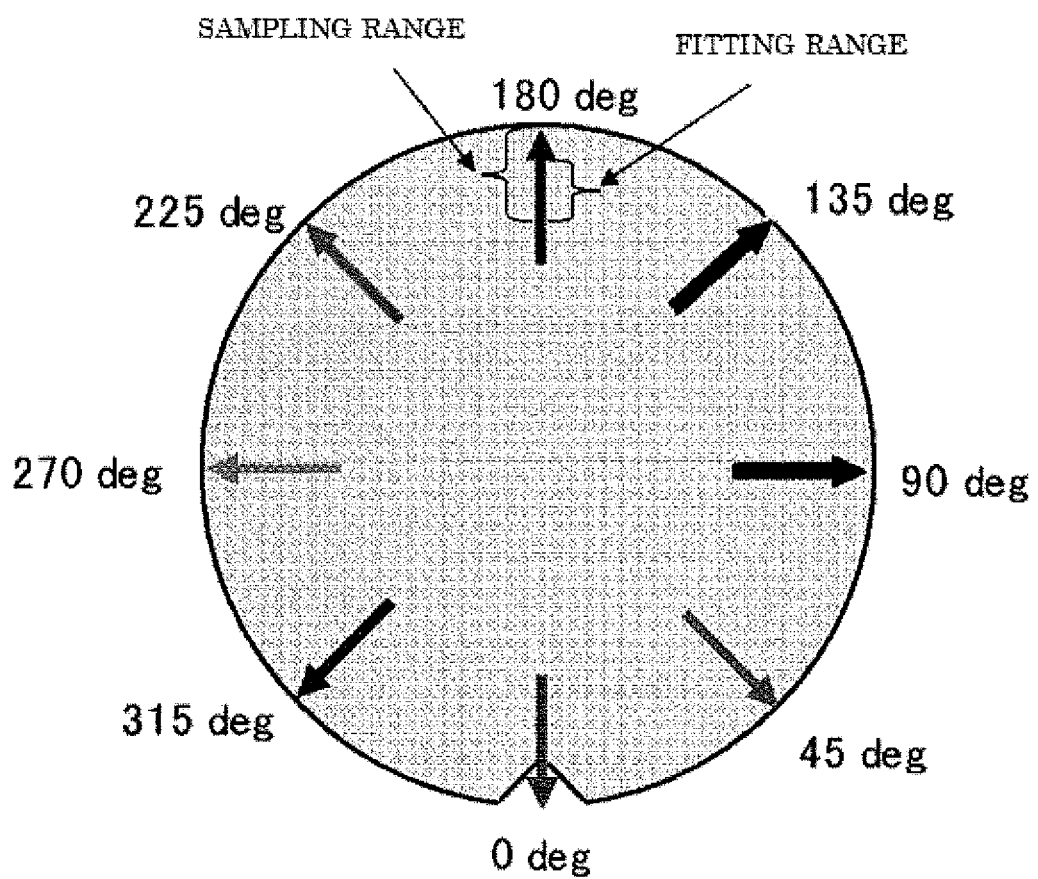
FIG. 13 is a diagram showing sampling conditions of warp data.
Figure 14:
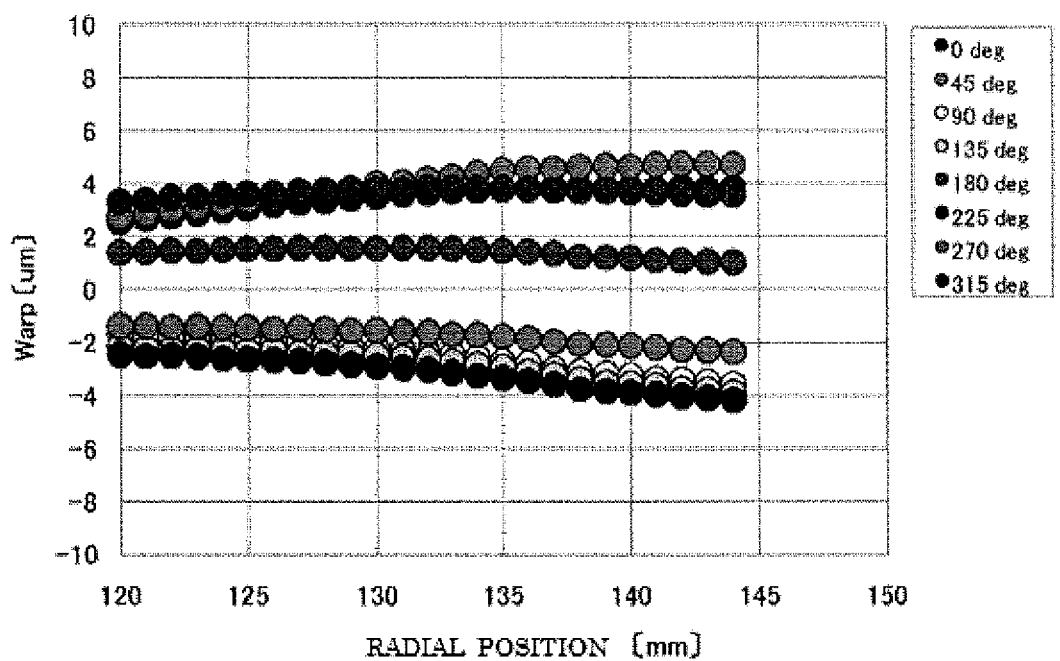
FIG. 14 is a graph of sampled warp data.

FIG. 14 shows the warp data of the outer circumferential portion of the semiconductor wafer, sampled within the set sampling range with measurement angles shown in FIG. 13.

Next, the procedure of fitting of warp data with a fitting function in a fitting range will be described.

Regarding the fitting function, since it is important to evaluate great curvilinear variation in warp data of the outer circumferential portion, the reference plane needs to be a straight line. Accordingly, the fitting function for fitting is preferably a linear function (y=ax+b), where y represents a function, x represents an arbitrary variant of a radial position, and a and b represent constants.

The procedure of fitting begins with the obtainment of a linear approximation equation within the fitting range of the warp data for each measurement angle.

Figure 16:
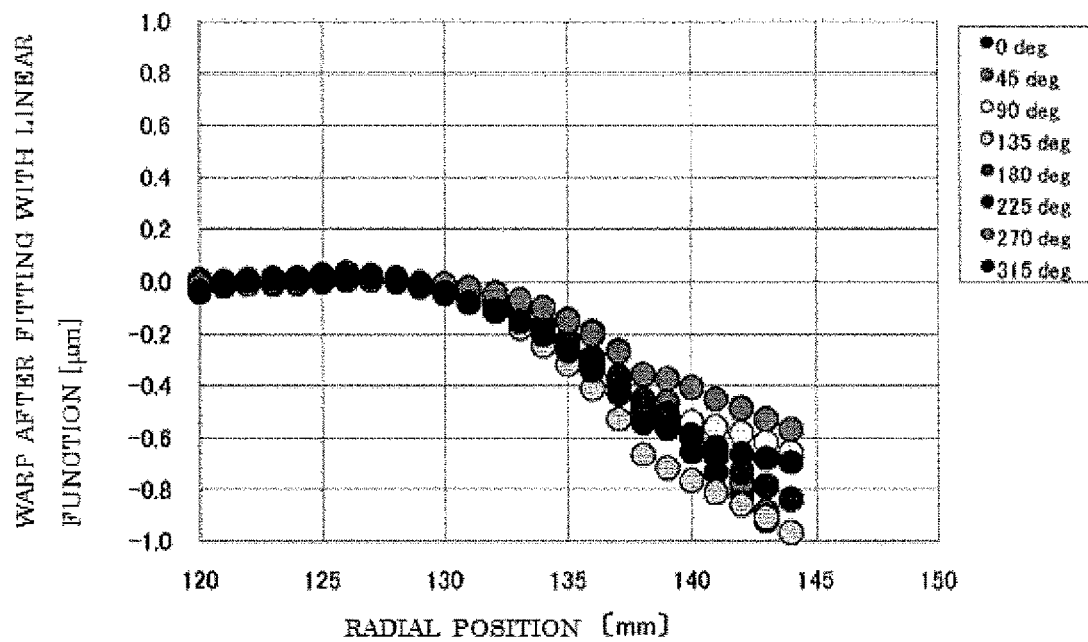
FIG. 16 is a graph of warp data after fitting.

An exemplary method of the obtainment is to determine constants a and b that make the following equation 1 minimum within the fitting range for each measurement angle by using the least squares method, Solver of Excel, and programming with Visual Basic as shown, for example, in FIGS. 15(a) and 15(b) to obtain the linear approximation equation (y=ax+b).

$$\Sigma[((ax+b)-f(x))^2] \qquad \text{(Equation 1)}$$

where f(x) is an actual measurement of warp data at an arbitrary position in the radial direction. The fitting [f(x)−(ax+b)] of the warp data for each measurement angle is performed by using the determined constants a and b for each measurement angle. FIG. 16 shows data after the fitting [f(x)−(ax+b)] of the warp data in a sampling range shown in FIG. 14.

Figure 17:
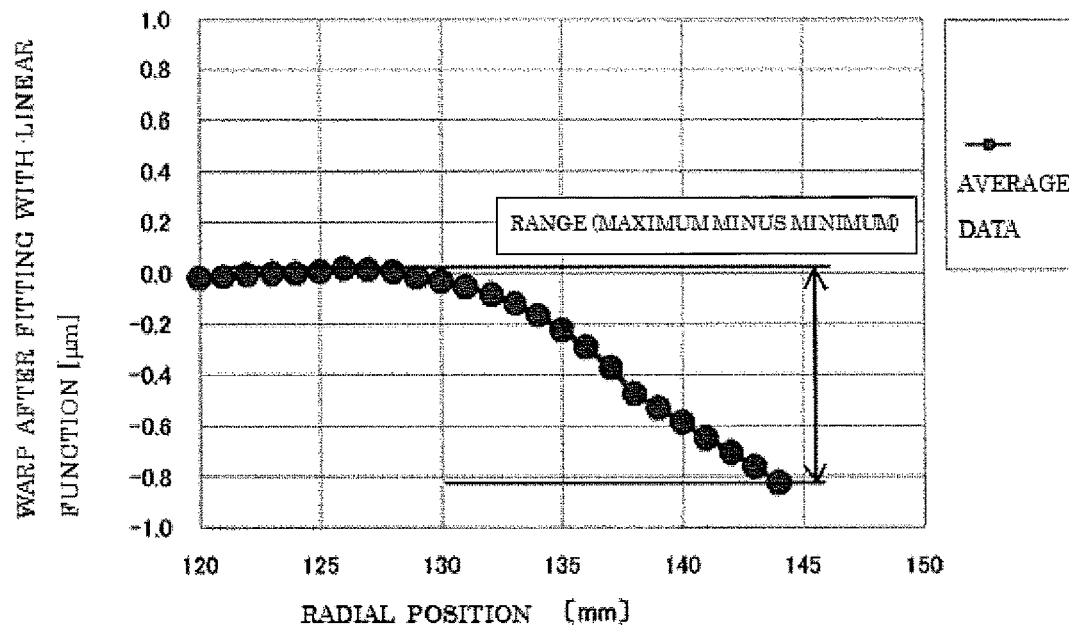
FIG. 17 is a graph of the average of warp data after fitting.

FIG. 17 shows the average of warp data (FIG. 16) after the fitting for each measurement angle. From FIG. 17, the difference (Range) between the maximum and the minimum is calculated in the range between the edge and the position $1/10$ of the diameter radially away from the edge toward the center, i.e., the range from 120 mm to 150 mm. The nanotopography of a semiconductor wafer surface after mirror-polishing can be presumed with high precision on the basis of the calculated Range. The Range may be calculated directly from the data after fitting for each measurement angle shown in FIG. 16 without averaging, or from the data for one measurement angle.

Figure 18:
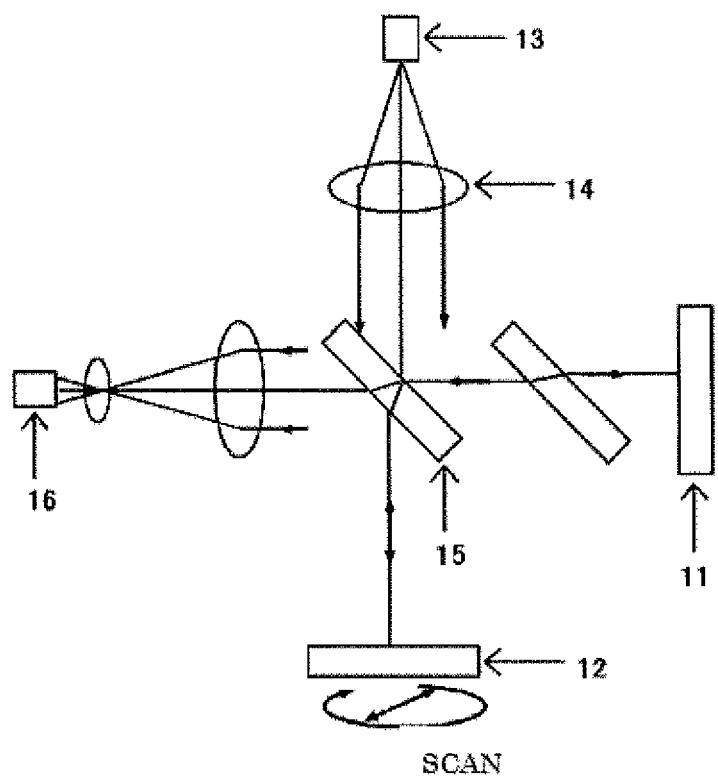
FIG. 18 is a schematic diagram showing the principle of configuration of a Michelson interferometer.

Nanomapper made by ADE Corp., which is typically used in measurement of the nanotopography of a mirror-polished wafer, will now be briefly described. Nanomapper uses a Michelson interferometer. FIG. 18 shows the configuration of the Michelson interferometer.

Figure 19:
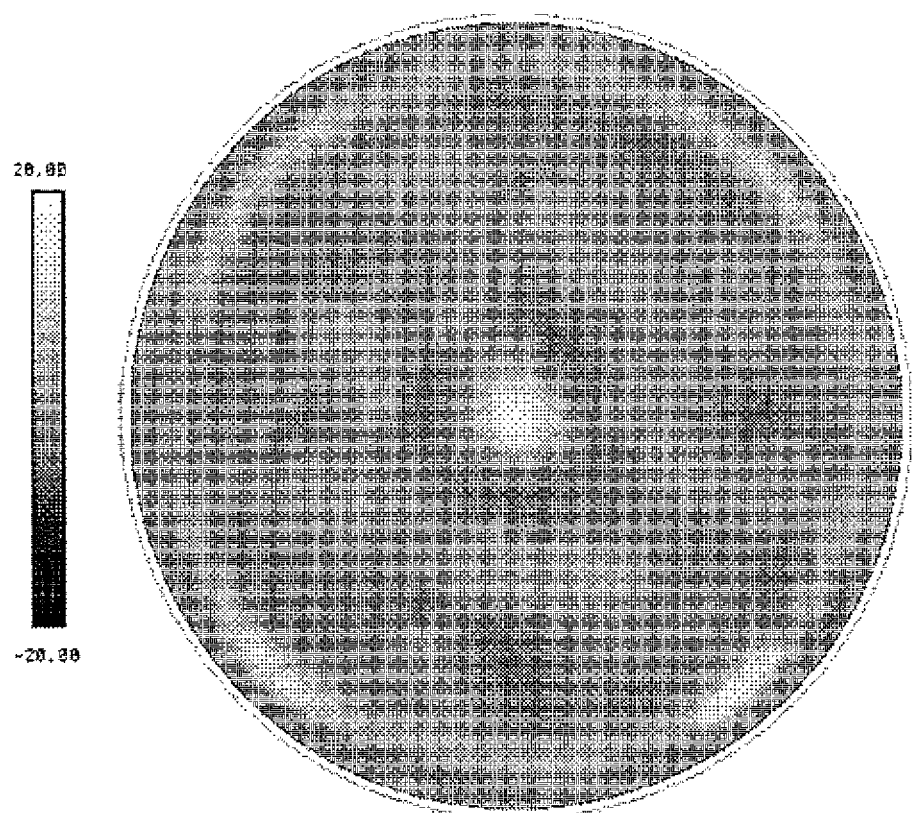
FIG. 19 is an image obtained by a Michelson interferometer.
Figure 20:
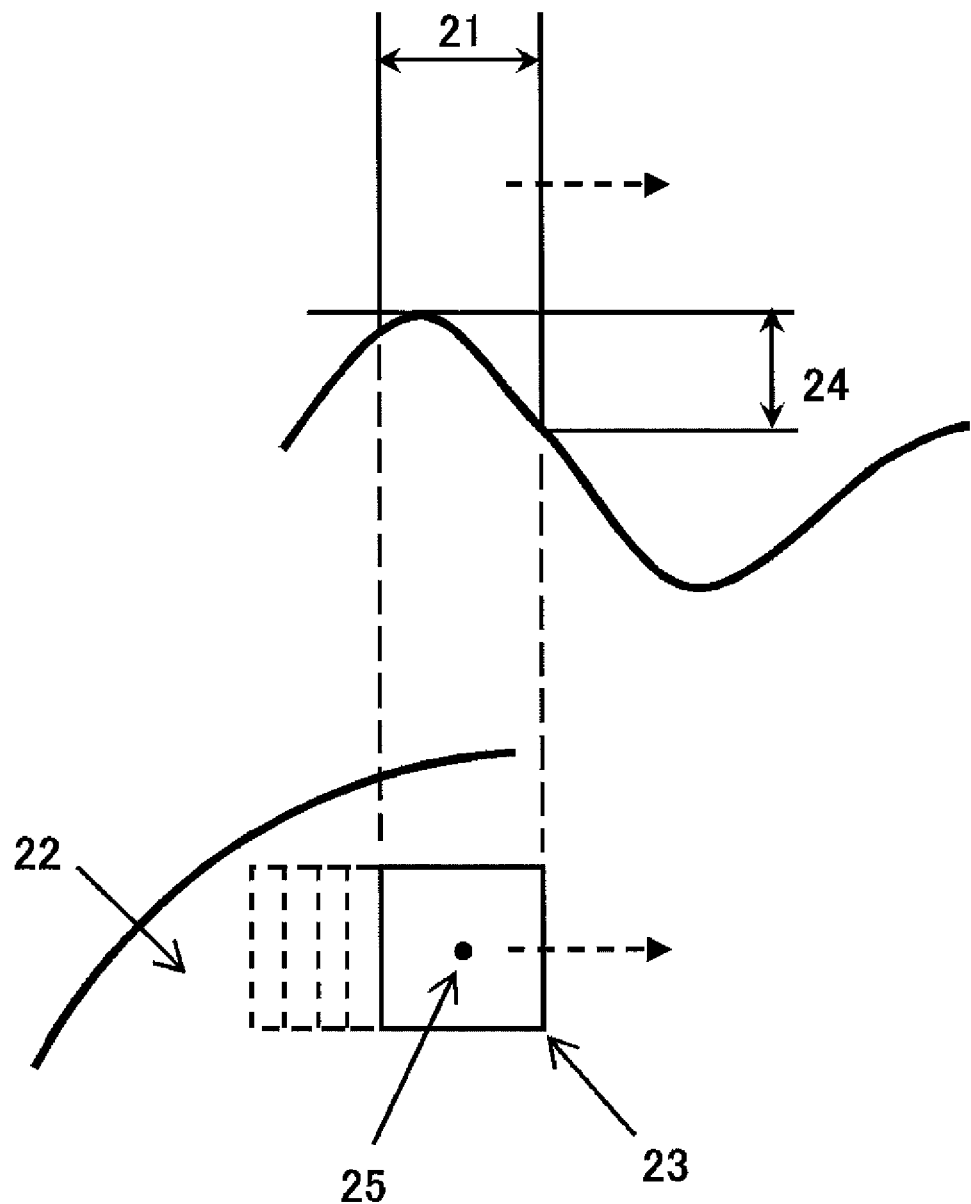
FIG. 20 is a schematic diagram showing a measuring method with Nanomapper.

First, light emitted from a light source 13 becomes a parallel ray through a collimator lens 14 and is then divided into two optical paths with a half mirror 15 (amplitude splitting). Luminous flux divided into two optical paths are reflected from a reference mirror 11 and an object 12 to be measured (corresponding to a semiconductor wafer, here), and each reflected flux returns the original optical path and is superposed with the half mirror 15. A CCD camera 16 then catches an image of interference fringes (FIG. 19). The reference mirror 11 on one side has a precisely polished plane (a reference plane), and the shape of a surface of the object 12 to be measured on the other side is measured. The data in a plane of the semiconductor wafer obtained by the interferometer is processed to remove noise, etc. As shown in FIG. 20, a peak-to-valley value 24 (the maximum minus the minimum) in a window 23 is replaced with a central value 25 of the window 23 while a window size 21, which is determined by setting, is moved in a plane of the wafer 22 so that nanotopography data is obtained.

A value of the above window size generally used is 0.5 mm to 10 mm. Although it depends on wafer standards of customers (device fabrication makers), the value of the window size 21 experientially frequently used in conventional management of nanotopography at an intermediate step is 10 mm in consideration of modification by mirror-polishing during the mirror-polishing step.

Figure 21:
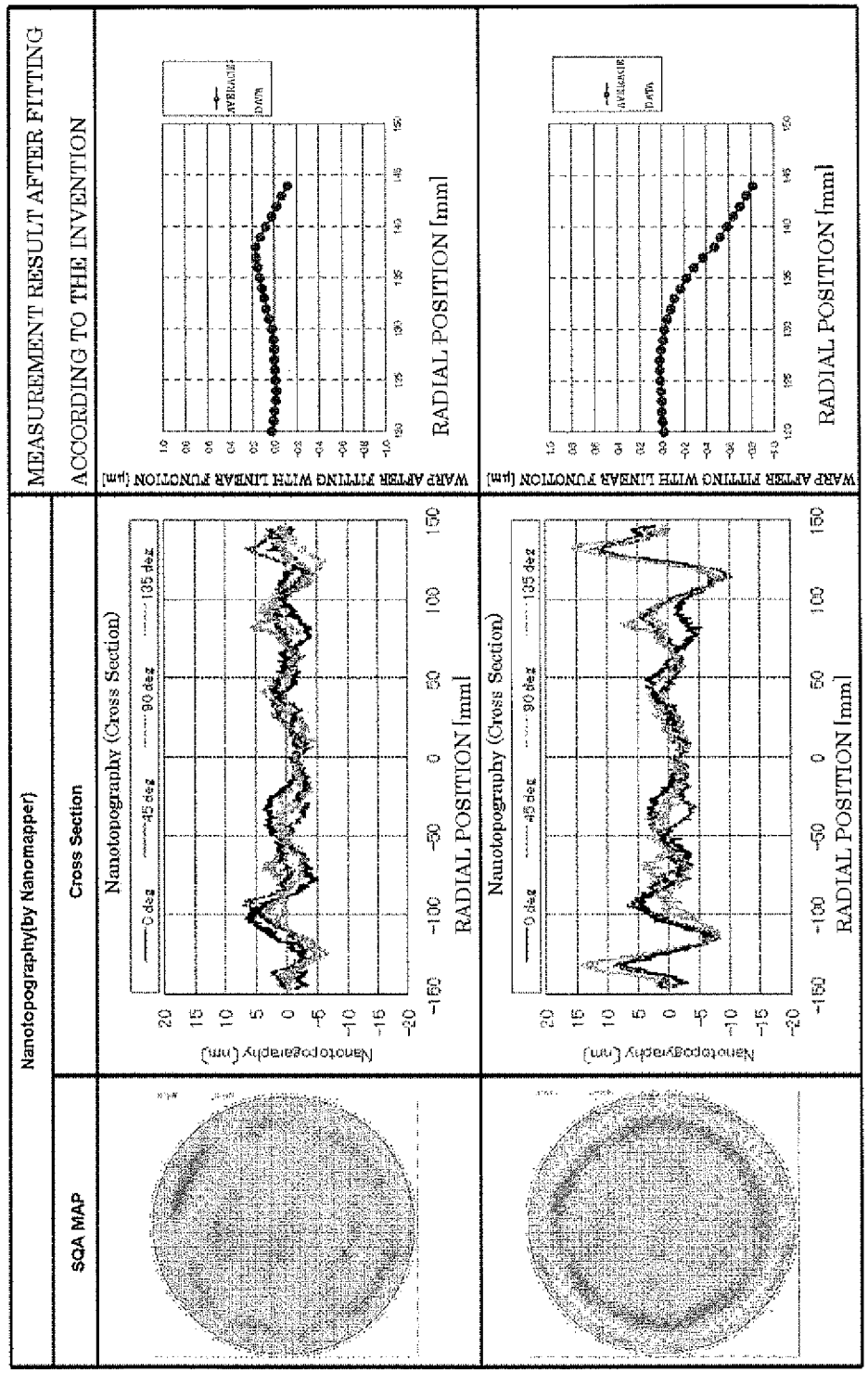
FIG. 21 is a diagram of warp data after fitting according to the present invention about a semiconductor wafer after lapping and the nanotopography of a mirror-polished wafer.

A silicon single crystal wafer having a diameter of 300 mm manufactured by the CZ method was used as a sample wafer to check the correlation between warp data obtained by the present invention and nanotopography measured by Nanomapper. The warp data of a wafer after lapping was first measured with a capacitive shape measurement device. According to the present invention, the optimal sampling range of the outer circumferential portion, the fitting range, and the fitting function was then set and the fitting operation was performed to obtain the warp data of the outer circumferential portion. FIG. 21 shows the warp data of a mirror-polished wafer obtained by performing the subsequent etching step and the double-side mirror polishing step in this order on the sample wafer after lapping and the corresponding image and cross-sectional shape obtained by measurement with Nanomapper.

FIG. 21 shows that in the warp data obtained by the present invention, when the Range is large, the displacement of ring unevenness at the outer circumferential portion in the cross-sectional shape data obtained by the measurement with Nanomapper is large and thus good correlation is obtained.

As described above, the warp data of a wafer having process strain after an intermediate step such as a lapping step, measured according to the present invention, has the correlation with the nanotopography of the wafer after the mirror-polishing step, measured by an optical measuring instrument. The nanotopography of a wafer surface after the final mirror-polishing step can be evaluated with high precision by using the inventive evaluation method right after an intermediate step such as the slicing step, the lapping step, the grinding step, and the etching step in a semiconductor-wafer manufacturing method.

A method of controlling a semiconductor-wafer manufacturing process by the inventive evaluation method will now be described. In this control, some semiconductor wafers are picked up depending on a predetermined standard and measured by the inventive evaluation method; if the Range of the measurement result after fitting exceeds a predetermined an acceptance and rejection criterion value, feedback and feedforward are preferably given to the manufacturing process.

(Sampling Evaluation)

A sampling evaluation is typically performed on one lot (per ingot) composed of about 100 to 250 semiconductor wafers. For wafers after the slicing step, wafers are sampled up from three places of a head portion K, a central portion C, and a tail portion P in an ingot slicing location. For wafers after the lapping step, 1 to 4 wafers are sampled up from 25 to 50 wafers.

The Range (the maximum minus the minimum) of wafers sampled up in this way was calculated by the inventive evaluation method to evaluate nanotopography of wafer surfaces after the final mirror-polishing step.

(Defective Judgment)

The acceptance and rejection criterion value is preferably set as Range ≤0.7 μm to readily judge a defective wafer on the basis of the calculated Range. When Range ≤0.7 μm holds, the nanotopography of a wafer after the mirror-polishing step will be sufficiently good.

If the sampling evaluation result of all evaluated wafers exceeds the acceptance and rejection criterion value, the concerned lot is judged such that all wafers are defective (lot out), and feedback is given to the process to be controlled. Even when a defective wafer is found, if at least one wafer is judged to be non-defective, feedback is given to the process to be controlled and feedforward is given to the final inspection step.

(Feedback to Manufacturing Process)

Feedback of the evaluation result to the slicing step, the lapping step, or the like will be described by way of example.

Since the slicing step basically cannot adjust conditions, analysis is conducted for improvement. A slicing apparatus with which a defective wafer is sliced, and the material of a wire, a main roller, or the like of the apparatus are subjected to a differential analysis.

With regard to the lapping step, adjustment such as modification of a turn table, exchange of a carrier, or cleaning of a groove is carried out such that the evaluation result becomes within the criterion value. If the evaluation result does not become within the criterion value by these adjustment, then the turn table is exchanged.

With regard to the double-disc grinding step, the position of grinding wheels in the direction of a grinding wheel axis with respect to a wafer is adjusted (sift) and a tilt of a grinding wheel surface with respect to a wafer surface is adjusted (tilt) such that the evaluation result becomes within the criterion value. The flow amount of right and left static pressure pads, which hold a wafer, may be adjusted. If the evaluation result does not become within the criterion value by these adjustment, then a carrier is exchanged or the grinding wheels are exchanged.

(Feedforward to Final Inspection Step)

When nanotopography is among product requirements, after the final mirror-polishing step, inspection of all wafers and selection are carried out in the final inspection step with Nanomapper, or the like. When nanotopography is not among product requirements, 25 wafers in one lot are evaluated by the present invention to give feedforward to the final inspection step.

This type of control method can control an intermediate step in the semiconductor-wafer manufacturing method, such as the slicing step, the lapping step, the grinding step, and the etching step, thereby enabling quick response to change in manufacturing conditions and improvement. In addition, the quality of a wafer can also be controlled in an intermediate step before the mirror-polishing step, and reduction in product loss and improvement in yield and productivity are thus expected.

A semiconductor-wafer manufacturing method by using the above control method in the semiconductor-wafer manufacturing process can grasp failure etc., during the manufacturing process in the early stage and manufacture a semiconductor wafer having an improved nanotopography efficiently at a high yield.

EXAMPLE

The present invention will be more specifically described with reference to examples, but the present invention is not limited to these examples.

Example 1

According to the present invention, warp data of a wafer surface having process stain, obtained with a capacitive shape measurement device, was processed by using the combination of the optimum sampling range of the outer circumferential portion, the fitting range, and the fitting function.

A silicon single crystal wafer having a diameter of 300 mm manufactured by the CZ method was used as a sampling wafer. The warp data of the wafer after the lapping step and before the mirror-polishing was measured with the capacitive shape measurement device. The sampling range of the outer circumferential portion of the warp data was set at the range between the edge and a position 1/10 of the diameter radially away from the edge toward the center (the range from 120 mm to 150 mm radially away from the center); the fitting range of the warp data in the sampling range was set at the range between the position 1/10 of the diameter radially away from the edge toward the center and 1/30 of the diameter radially therefrom toward the edge (the range from 120 mm to 130 mm radially away from the center); the fitting function was determined to be a linear function; fitting was performed on the warp data to calculate the Range (the maximum minus the minimum) at the outer circumferential portion.

The wafer was subjected to the subsequent etching step and double-side mirror polishing step in this order to obtain a mirror-polished wafer, the displacement of ring unevenness at the outer circumferential portion of the mirror-polished wafer was measured with Nanomapper, and the correlation of the calculated Range with the one-to-one corresponding displacement of ring unevenness was investigated and compared.

Figure 22:
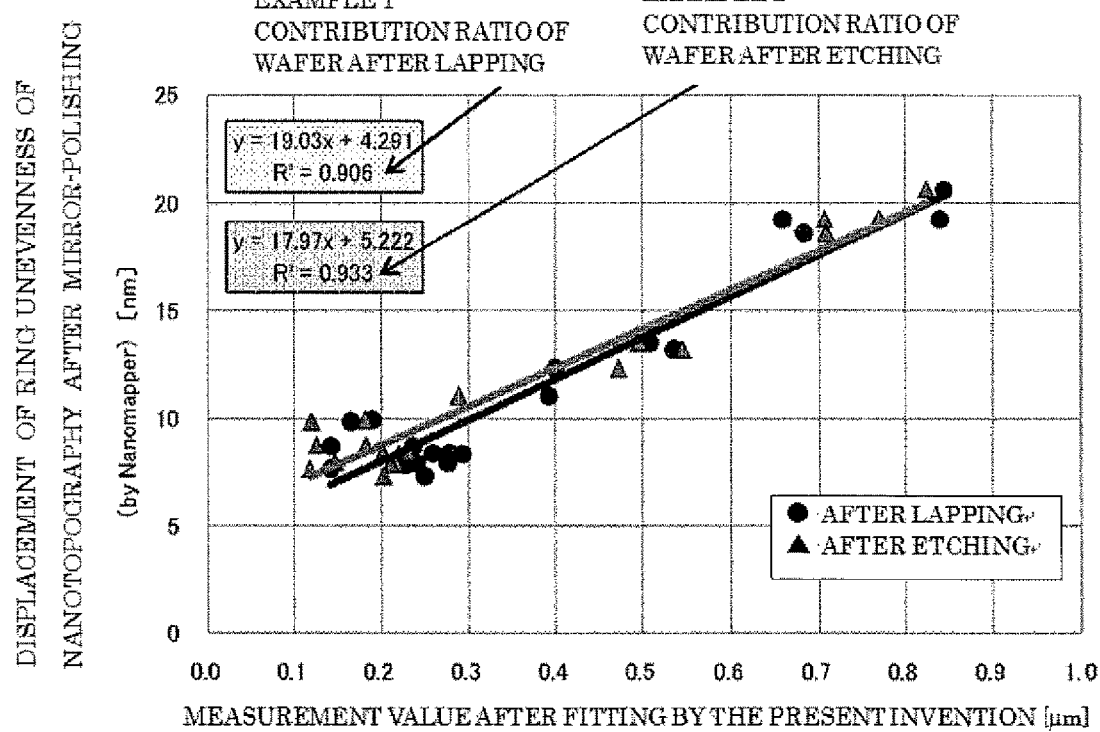
FIG. 22 is a graph of correlation of the nanotopography of a mirror-polished wafer with respect to the warp data of a semiconductor wafer after fitting according to the present invention.

As shown in FIG. 22, the result was that the contribution ratio was 0.91, and a very high correlation was thus obtained.

Example 2

According to the present invention, warp data measurement and fitting were performed to calculate the Range as in example 1 except for using a wafer after the lapping step and the etching step and before mirror-polishing. The wafer was subjected to the subsequent double-side mirror polishing step to obtain a mirror-polished wafer, the displacement of ring unevenness at the outer circumferential portion of the mirror-polished wafer was measured with Nanomapper, and the correlation of the Range with the one-to-one corresponding displacement of the ring unevenness was investigated and compared.

As shown in FIG. 22, the result was that the contribution ratio was 0.93, and a very high correlation was thus obtained.

In summary, as shown in Table 1, the contribution ratio right after lapping was greatly improved from 0.24 (FIG. 6), which was obtained by conventional analysis of warp data, to 0.91 by fitting according to the present invention; the contribution ratio right after etching was improved from 0.71 (FIG. 6), which was obtained by conventional analysis of warp data, to 0.93 by fitting according to the present invention.

TABLE 1

| | CONTRIBUTION RATIO ($R^2$) | |
|---|---|---|
| | CONVENTIONAL METHOD | EXAMPLES 1, 2 |
| AFTER LAPPING | 0.24 | 0.91 |
| AFTER ETCHING | 0.71 | 0.93 |

It is to be noted that the present invention is not limited to the foregoing embodiment. The embodiment is just an exemplification, and any examples that have substantially the same feature and demonstrate the same functions and effects as those in the technical concept described in claims of the present invention are included in the technical scope of the present invention.

The invention claimed is:

1. A semiconductor-wafer evaluation method of evaluating nanotopography of a surface of a semiconductor wafer manufactured by a manufacturing method including a slicing step, at least one of a lapping step and a grinding step, an etching step, and a mirror-polishing step, comprising:
before the mirror-polishing step, measuring warp data of displacement of the surface of the semiconductor wafer with a capacitive shape measurement device: setting a prescribed width of an outer circumferential portion of the semiconductor wafer as a sampling range; performing fitting of the warp data within the sampling range with a fitting function in a predetermined fitting range to thereby eliminate an effect of variation in the warp data at the outer circumferential portion of the semiconductor wafer, the variation being caused by process strain: calculating a difference between a maximum and a minimum of the warp data after the fitting within the sampling range; and after the mirror-polishing step, evaluating the nanotopography of the surface of the semiconductor wafer on the basis of the calculated difference, wherein the sampling range is set within a range between an edge of the semiconductor wafer and a position 1/10 of a diameter radially away from the edge, and the fitting range is set within a width ranging between the position 1/10 of the diameter radially away from the edge of the semiconductor wafer and 1/30 of the diameter radially therefrom toward the edge, and if the calculated difference is equal to or less than 0.7 pm, then the semiconductor wafer is judged as non-defective.

2. The semiconductor-wafer evaluation method according to claim 1, wherein the fitting function is a linear function.

3. A semiconductor-wafer manufacturing method comprising a slicing step, at least one of a lapping step and a grinding step, an etching step, and a mirror-polishing step, wherein a semiconductor wafer subjected to at least one of the slicing step, the lapping step, the grinding step, and an etching step is evaluated by the semiconductor-wafer evaluation method according to claim 1, and a semiconductor wafer is manufactured while at least one of the slicing step, the lapping step, the grinding step, and an etching step is controlled on the basis of a result of the evaluation.

4. A semiconductor-wafer manufacturing method comprising a slicing step, at least one of a lapping step and a grinding step, an etching step, and a mirror-polishing step, wherein a semiconductor wafer subjected to at least one of the slicing step, the lapping step, the grinding step, and an etching step is evaluated by the semiconductor-wafer evaluation method according to claim 2, and a semiconductor wafer is manufactured while at least one of the slicing step, the lapping step, the grinding step, and an etching step is controlled on the basis of a result of the evaluation.

* * * * *